(12) United States Patent
Chen et al.

(10) Patent No.: US 8,766,670 B2
(45) Date of Patent: Jul. 1, 2014

(54) SAMPLE-AND-HOLD CIRCUIT FOR GENERATING A VARIABLE SAMPLE DELAY TIME OF A TRANSFORMER AND METHOD THEREOF

(71) Applicant: Leadtrend Technology Corp., Hsin-Chu (TW)

(72) Inventors: Ren-Yi Chen, Hsin-Chu (TW); Yi-Lun Shen, Hsin-Chu (TW)

(73) Assignee: Leadtrend Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/802,903

(22) Filed: Mar. 14, 2013

(65) Prior Publication Data

US 2014/0043081 A1    Feb. 13, 2014

(30) Foreign Application Priority Data

Aug. 8, 2012  (TW) .............................. 101128544 A

(51) Int. Cl.
*G11C 7/02*  (2006.01)
(52) U.S. Cl.
USPC ............................................. 327/94; 327/91

(58) Field of Classification Search
USPC ................................................ 327/91, 93–95
See application file for complete search history.

(56) References Cited

U.S. PATENT DOCUMENTS

| 5,681,488 | A  | * | 10/1997 | Goto et al. | ................. | 219/69.18 |
| 6,958,920 | B2 | * | 10/2005 | Mednik et al. | .................. | 363/19 |
| 7,646,616 | B2 | * | 1/2010  | Wekhande et al. | ........ | 363/21.12 |

* cited by examiner

*Primary Examiner* — An Luu
(74) *Attorney, Agent, or Firm* — Winston Hsu; Scott Margo

(57) ABSTRACT

A sample-and-hold circuit for generating a variable sample delay time of a transformer includes a discharge detection unit, a sample delay time generation unit, and a comparator. The discharge detection unit generates a first voltage according to a first turning-on signal and a first reference current. Length of the first turning-on signal is varied with a discharge time of a present period of the transformer. The sample delay time generation unit generates a second voltage according to the first turning-on signal and a second reference current. The comparator generates a sample signal to a control circuit of the transformer according to a first voltage corresponding to a previous period of the transformer and a second voltage corresponding to the present period of the transformer. The first reference current is K times the second reference current, and $0<K<1$.

13 Claims, 4 Drawing Sheets

US 8,766,670 B2

SAMPLE-AND-HOLD CIRCUIT FOR GENERATING A VARIABLE SAMPLE DELAY TIME OF A TRANSFORMER AND METHOD THEREOF

BACKGROUND OF THE INVENTION

1. Field of the Invention

The present invention relates to a sample-and-hold circuit for generating a variable sample delay time of a transformer and a method thereof, and particularly to a sample-and-hold circuit for generating a variable sample delay time of a transformer and a method thereof that can generate the variable sample delay time varied with a load coupled to the transformer.

2. Description of the Prior Art

Please refer to FIG. 1. FIG. 1 is a diagram illustrating a transformer 100 according to the prior art. A control circuit 102 of a primary side of the transformer 100 is used for detecting a voltage of an auxiliary winding 104 to control an output voltage VOUT. Because the voltage of the auxiliary winding 104 is a positive voltage and a negative voltage in turn, the control circuit 102 needs to sample the voltage of the auxiliary winding 104 in a correct time. Generally speaking, a sample-and-hold circuit 108 generates a sample signal SS to a comparator 107 of the control circuit 102 after a switch 106 of the primary side of the transformer 100 is turned off for a period of time, where VREF is a reference voltage. However, because discharge times of the transformer 100 corresponding to different loads are different when the different loads coupled to a secondary side of the transformer 100, a stabilization effect for the output voltage VOUT of the control circuit 102 may be not good, and further the control circuit 102 samples a wrong voltage of the auxiliary winding 104 when a light load coupled to the secondary side of the transformer 100 if the sample-and-hold circuit 108 utilizes a fixed sampling time to sample the voltage of the auxiliary winding 104.

SUMMARY OF THE INVENTION

An embodiment provides a sample-and-hold circuit for generating a variable sample delay time of a transformer. The sample-and-hold circuit includes a discharge detection unit, a sample delay time generation unit, and a comparator. The discharge detection unit is used for generating a first voltage according to a first turning-on signal and a first reference current, where length of the first turning-on signal is varied with a discharge time of a present period of the transformer. The sample delay time generation unit is used for generating a second voltage according to the first turning-on signal and a second reference current. The comparator is used for generating a sample signal to a control circuit of the transformer according to a first voltage corresponding to a previous period of the transformer and a second voltage corresponding to the present period of the transformer, where the first reference current is K times the second reference current, wherein 0<K<1.

Another embodiment provides a method for generating a variable sample delay time of a transformer. A sample-and-hold circuit for generating the variable sample delay time includes a discharge detection unit, a sample delay time generation unit, and a comparator, where the discharge detection unit includes a first switch, a first capacitor, a second switch, a third switch, and a second capacitor, and the sample delay time generation unit includes a fourth switch, a third capacitor, and a fifth switch, where the first capacitor, the second capacitor, and the third capacitor are the same. The method includes generating a first voltage corresponding to a present period of the transformer according to a first turning-on signal and a first reference current, wherein length of the first turning-on signal is varied with a discharge time of the present period of the transformer; generating a second voltage corresponding to the present period according to the first turning-on signal and a second reference current; and generating a sample signal to a control circuit of the transformer according to a first voltage corresponding to a previous period of the transformer and a second voltage corresponding to the present period. The he first reference current is K times the second reference current, where 0<K<1.

The present invention provides a sample-and-hold circuit for generating a variable sample delay time of a transformer and a method thereof. The sample-and-hold circuit and the method utilize a discharge detection unit to generate a first voltage corresponding to a present period of the transformer according to a first turning-on signal and a first reference current, and utilize a sample delay time generation unit to generate a second voltage corresponding to the present period of the transformer according to the first turning-on signal and a second reference current. Then, a comparator generates a sample signal to a control circuit of the transformer according to a first voltage corresponding to a previous period of the transformer and the second voltage corresponding to the present period. Because the first reference current is different from the second reference current, time for the comparator generating the sample signal is varied with a load coupled to a secondary side of the transformer. Therefore, compared to the prior art, the present invention can overcome a disadvantage of the sample-and-hold circuit utilizing a fixed sampling time to sample a voltage of an auxiliary winding.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
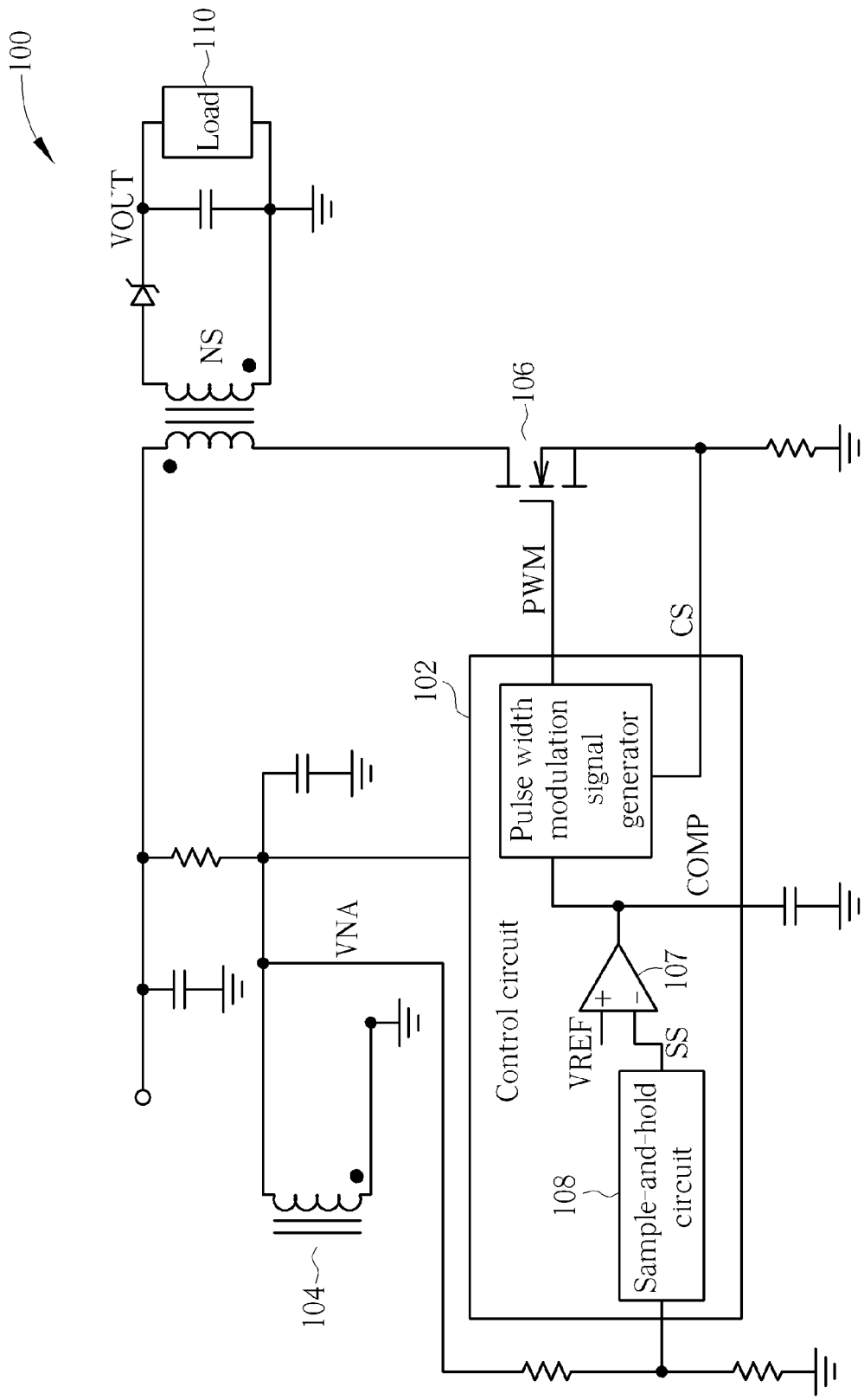
FIG. 1 is a diagram illustrating a transformer according to the prior art.
Figure 2:
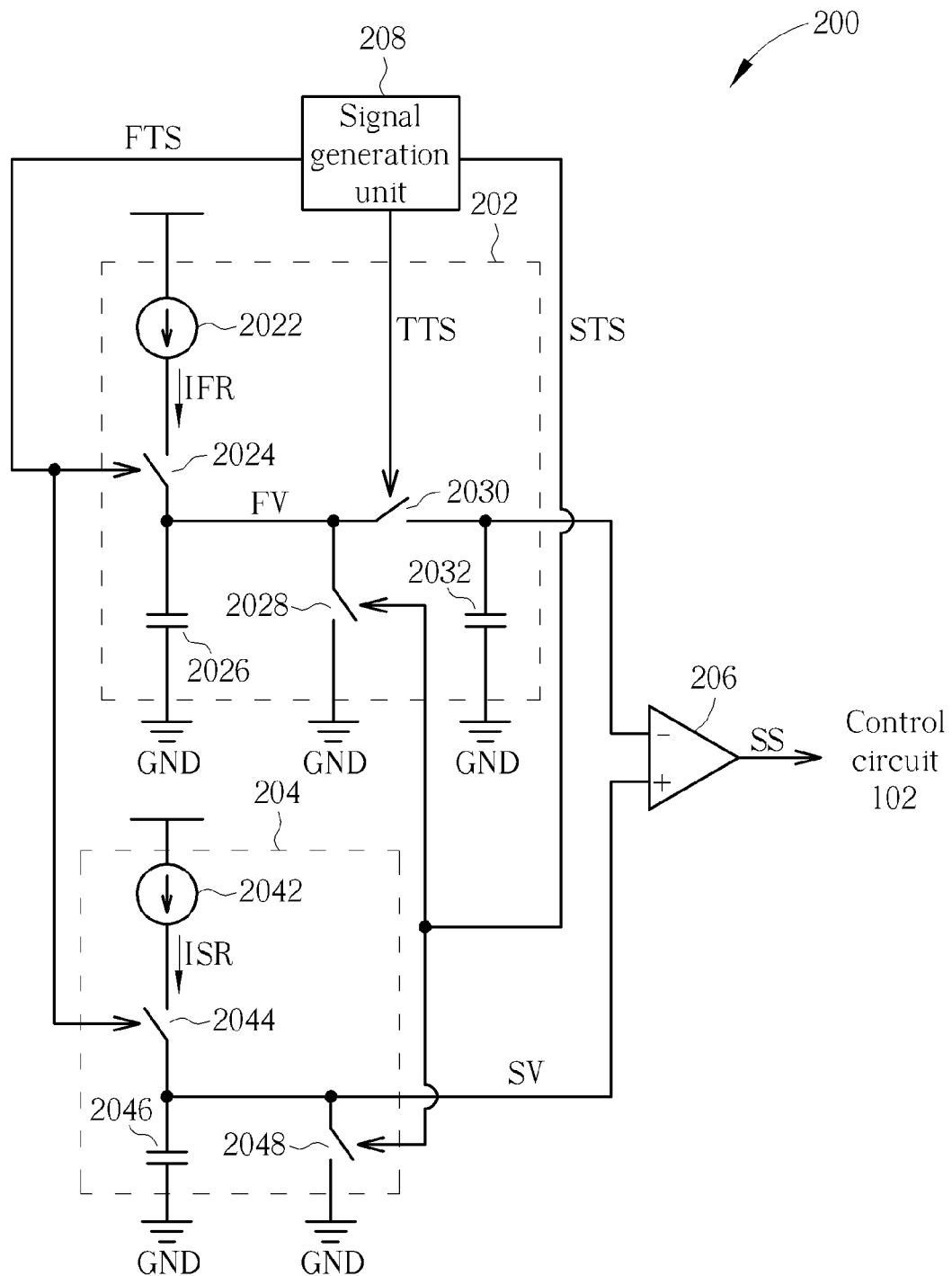
FIG. 2 is a diagram illustrating a sample-and-hold circuit for generating a variable sample delay time of a transformer according to an embodiment

Please refer to FIG. 2. FIG. 2 is a diagram illustrating a sample-and-hold circuit 200 for generating a variable sample delay time of a transformer according to an embodiment, where the sample-and-hold circuit 200 is used for substituting for the sample-and-hold circuit 108 (as shown in FIG. 1) in the transformer 100, and the transformer 100 is a flyback transformer. But, the present invention is not limited to the sample-and-hold circuit 200 being applied to the flyback transformer. As shown in FIG. 2, the sample-and-hold circuit 200 includes a discharge detection unit 202, a sample delay time generation unit 204, and a comparator 206. The discharge detection unit 202 is used for generating a first voltage FV according to a first turning-on signal FTS and a first reference current IFR, where length of the first turning-on signal FTS is varied with a discharge time of a present period of the transformer 100. The sample delay time generation unit 204 is used for generating a second voltage SV according to the first turning-on signal FTS and a second reference current ISR. The comparator 206 is used for generating a sample signal SS to the comparator 107 (as shown in FIG. 1) of the control circuit 102 of the transformer 100 according to a first voltage PFV of a previous period of the transformer 100 and a second voltage SV of the present period of the transformer 100, where the first voltage PFV of the previous period corresponds to the previous period of the transformer 100 and the second voltage SV corresponds to the present period of the transformer 100. The first reference current IFR is K times the second reference current ISR, where 0<K<1, and K is varied with a load 110 coupled to the secondary side of the transformer 100. That is to say, K is varied with a voltage of a pin (e.g. a COMP pin or a CS pin) of the control circuit 102, where the voltage of the pin of the control circuit 102 is varied with the load 110 coupled to the secondary side of the transformer 100. In addition, when the load 110 coupled to the secondary side of the transformer 100 is increased, K is also increased. But, the present invention is not limited to K being varied with the load 110 coupled to the secondary side of the transformer 100. That is to say, K can be a predetermined ratio.

As shown in FIG. 2, the discharge detection unit 202 includes a first current source 2022, a first switch 2024, a first capacitor 2026, a second switch 2028, a third switch 2030, and a second capacitor 2032. As shown in FIG. 2, the first current source 2022 is used for providing the first reference current IFR; the first switch 2024 is coupled to the first current source 2022 for being turned on and turned off according to the first turning-on signal FTS; the first capacitor 2026 is coupled between the first switch 2024 and the ground GND, where the first reference current IFR charges the first capacitor 2026 to generate the first voltage FV when the first switch 2024 is turned on according to the first turning-on signal FTS; the second switch 2028 is coupled between the first switch 2024 and the ground GND for being turned on and turned off according to a second turning-on signal STS; the third switch 2030 is coupled to the first switch 2024, the first capacitor 2026, and the second switch 2028 for being turned on and turned off according to a third turning-on signal TTS; and the second capacitor 2032 is coupled to the third switch 2030, the comparator 206, and the ground GND for stabilizing the first voltage FV when the third switch 2030 is turned on according to the third turning-on signal TTS. In addition, the third switch 2030 is turned on according to the third turning-on signal TTS after the first switch 2024 is turned off according to the first turning-on signal FTS and before a positive edge of a turning-on time of the switch 106 of the primary side of the transformer 100, and the second switch 2028 is turned on according to the second turning-on signal STS to clear remnant charges stored in the first capacitor 2026 during the turning-on time of the switch 106 of the primary side of the transformer 100.

As shown in FIG. 2, the sample delay time generation unit 204 includes a second current source 2042, a fourth switch 2044, a third capacitor 2046, and a fifth switch 2048. The second current source 2042 is used for providing the second reference current ISR. The fourth switch 2044 is coupled to the second current source 2042 for being turned on and turned off according to the first turning-on signal FTS. The third capacitor 2046 is coupled between the fourth switch 2044 and the ground GND, where the second reference current ISR charges the third capacitor 2046 to generate the second voltage SV when the fourth switch 2044 is turned on according to the first turning-on signal FTS. In addition, the third capacitor 2046, the second capacitor 2032, and the first capacitor 2026 are the same. The fifth switch 2048 is coupled to the fourth switch 2044, the comparator 206, and the ground GND for being turned on and turned off according to the second turning-on signal STS. In addition, the fifth switch 2048 is turned on according to the second turning-on signal STS to clear charges stored in the third capacitor 2046 during the turning-on time of switch 106 of the primary side of the transformer 100.

In addition, the sample-and-hold circuit 200 further includes a signal generation unit 208 for generating the first turning-on signal FTS, the second turning-on signal STS, and the third turning-on signal TTS.

Figure 3:
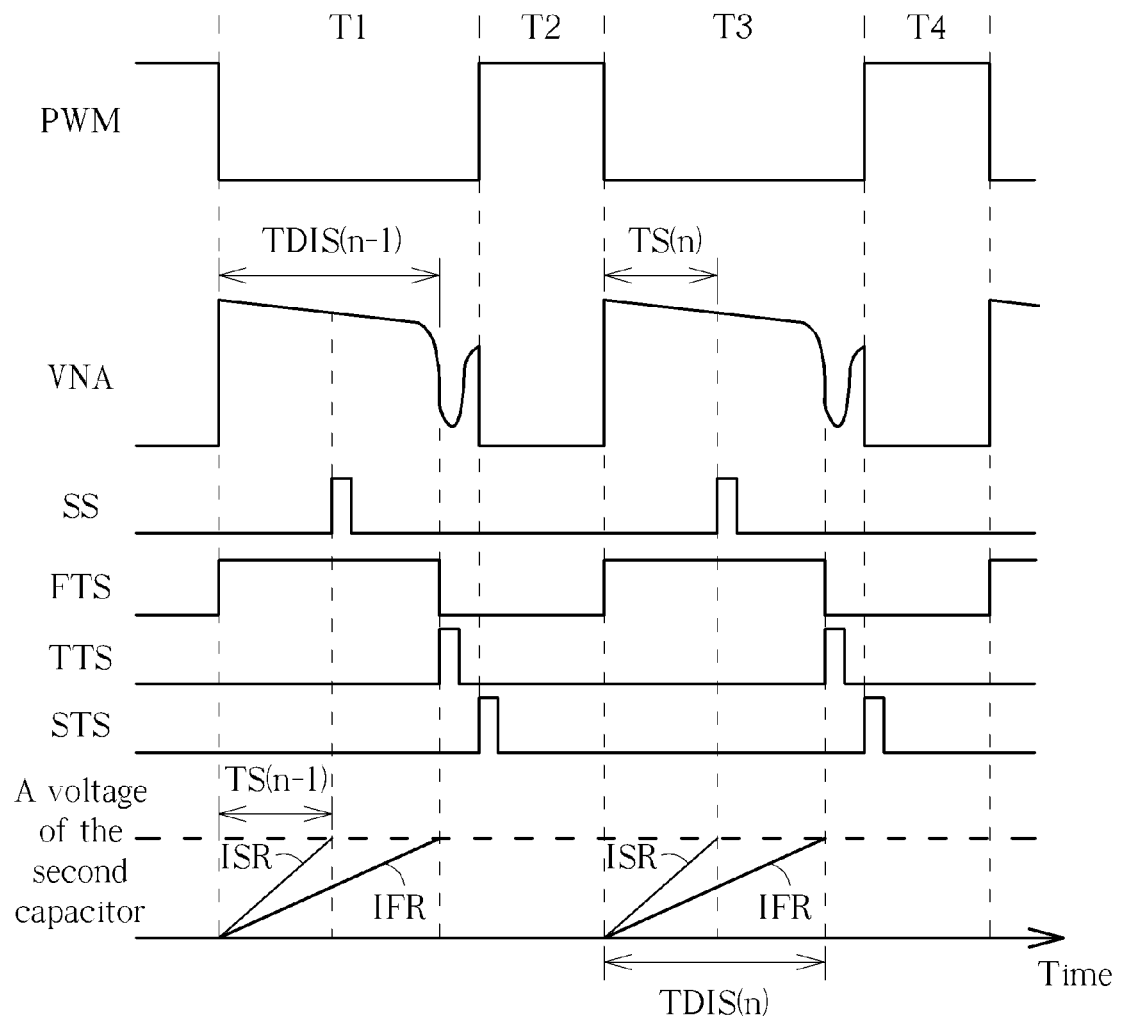
FIG. 3 is a timing diagram illustrating a pulse width modulation signal for controlling the switch of the primary side of the transformer, variation of a voltage of the auxiliary winding, the first turning-on signal, the second turning-on signal, the third turning-on signal, the sample signal, a charging time of the first capacitor, and a charging time of the third capacitor.

Please refer to FIG. 3. FIG. 3 is a timing diagram illustrating a pulse width modulation signal PWM for controlling the switch 106 of the primary side of the transformer 100, variation of a voltage VNA of the auxiliary winding 104, the first turning-on signal FTS, the second turning-on signal STS, the third turning-on signal TTS, the sample signal SS, a charging time of the first capacitor 2026, and a charging time of the third capacitor 2046. As shown in FIG. 3, at an interval T1, because the pulse width modulation signal PWM is low, the switch 106 is turned off and a winding NS of the secondary side of the transformer 100 starts to discharge to the load 110, resulting in the voltage VNA of the auxiliary winding 104 starting to decrease. At a beginning of the interval T1, the first turning-on signal FTS is high, so the first switch 2024 and the fourth switch 2044 are turned on, and the first reference current IFR charges the first capacitor 2026 to generate a first voltage FV corresponding to the interval T1, and the second reference current ISR charges the third capacitor 2046 to generate a second voltage SV corresponding to the interval T1. At the interval T1, the third turning-on signal TTS is high between a negative edge of the first turning-on signal FTS and a positive edge of the turning-on time (an interval T2) of the switch 106 of the primary side of the transformer 100. Therefore, the second capacitor 2032 stabilizes the first voltage FV corresponding to the interval T1 when the third switch 2030 is turned on according to the third turning-on signal TTS.

At the interval T2 (that is, the turning-on time of the switch 106 of the primary side), the second turning-on signal STS is high, the second switch 2028 is turned on according to the second turning-on signal STS to clear remnant charges of the first capacitor 2026, and the fifth switch 2048 is turned on according to the second turning-on signal STS to clear charges stored in the third capacitor 2046.

At an interval T3, because the pulse width modulation signal PWM is low, the switch 106 is turned off and the winding NS of the secondary side of the transformer 100 starts to discharge to the load 110 again, resulting in the voltage VNA of the auxiliary winding 104 starting to decrease again. At a beginning of the interval T3, the first turning-on signal FTS is high, the first switch 2024 and the fourth switch 2044 are turned on, and the first reference current IFR charges the first capacitor 2026 again to generate a first voltage FV corresponding to the interval T3, and the second reference current ISR charges the third capacitor 2046 again to generate a second voltage SV corresponding to the interval T3. At the interval T3, a voltage of the second capacitor 2032 corresponds to the first voltage FV corresponding to the interval T1. That is to say, a voltage of an input terminal of the comparator 206 corresponds to the first voltage FV corresponding to the interval T1. Therefore, when the second voltage SV (a voltage of another input terminal of the comparator 206) corresponding to the interval T3 is greater than the first voltage FV corresponding to the interval T1, the comparator 206 generates a sample signal SS. Because the first reference current IFR is K times the second reference current ISR (that is, the second reference current ISR is greater than the first reference current IFR), a discharge time TDIS(n−1) (that is, length of the first turning-on signal FTS of the transformer 100 at the interval T1) for the first reference current IFR charging the first capacitor 2026 to generate the first voltage FV corresponding to the interval T1 is longer than a period TS(n) for the second reference current ISR charging the third capacitor 2046 to generate the second voltage SV corresponding to the interval T3. That is to say, the period TS(n) is K times the discharge time TDIS(n−1). Thus, the period TS(n) for the comparator 206 generating the sample signal SS is varied with the length (TDIS(n−1)) of the first turning-on signal FTS corresponding to the interval T1. At the interval T1, because the length of the first turning-on signal FTS is varied with the discharge time TDIS(n−1) of the transformer 100, the period TS(n) for the comparator 206 generating the sample signal SS is also varied with the discharge time TDIS(n−1) of transformer 100. That is to say, the period TS(n) for the comparator 206 generating the sample signal SS is varied with the load 110. In addition, TDIS(n) is length of the first turning-on signal FTS corresponding to the interval T3, and TS(n−1) is time for the comparator 206 generating the sample signal SS at the interval T1.

But, the present invention is not limited to voltage levels of the first turning-on signal FTS, the second turning-on signal STS, and the third turning-on signal TTS in FIG. 3. Any configuration in which the sample-and-hold circuit 200 generating a variable sample delay time varied with the load 110 according to the first turning-on signal FTS, the second turning-on signal STS, and the third turning-on signal TTS falls within the scope of the present invention.

Figure 4:
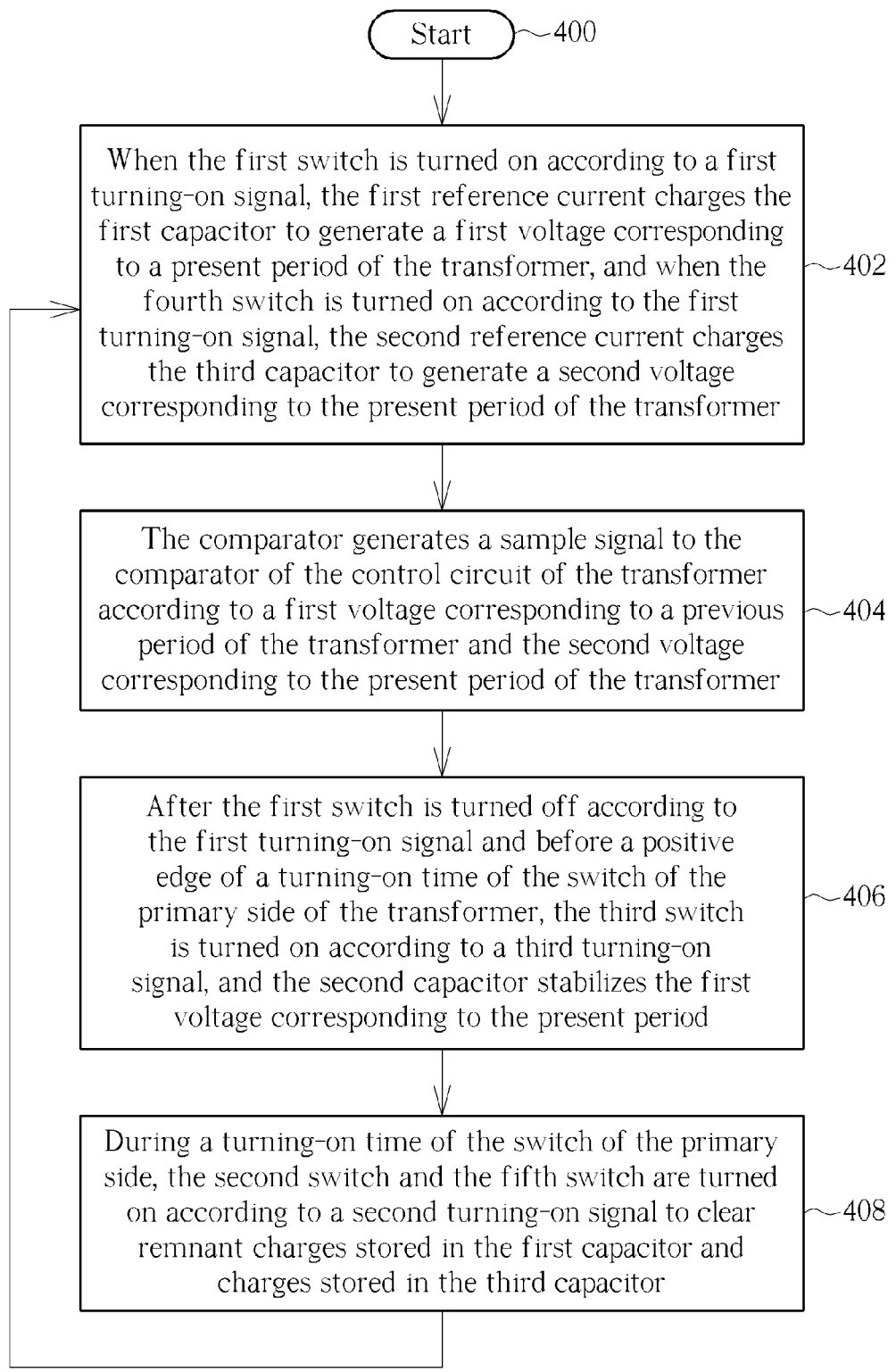
FIG. 4 is a flowchart illustrating a method for generating a variable sample delay time of a transformer according to another embodiment.

Please refer to FIG. 2, FIG. 3, and FIG. 4. FIG. 4 is a flowchart illustrating a method for generating a variable sample delay time of a transformer according to another embodiment. The method in FIG. 4 is illustrated using the sample-and-hold circuit 200 in FIG. 2. Detailed steps are as follows:

Step 400: Start.

Step 402: When the first switch 2024 is turned on according to a first turning-on signal FTS, the first reference current IFR charges the first capacitor 2026 to generate a first voltage FV corresponding to a present period of the transformer 100, and when the fourth switch 2044 is turned on according to the first turning-on signal FTS, the second reference current ISR charges the third capacitor 2046 to generate a second voltage SV corresponding to the present period of the transformer 100.

Step 404: The comparator 206 generates a sample signal SS to the comparator 107 of the control circuit 102 of the transformer 100 according to a first voltage FV corresponding to a previous period of the transformer 100 and the second voltage SV corresponding to the present period of the transformer 100.

Step 406: After the first switch 2024 is turned off according to the first turning-on signal FTS and before a positive edge of a turning-on time of the switch 106 of the primary side of the transformer 110, the third switch 2030 is turned on according to a third turning-on signal TTS, and the second capacitor 2032 stabilizes the first voltage FV corresponding to the present period.

Step 408: During a turning-on time of the switch 106 of the primary side, the second switch 2028 and the fifth switch 2048 are turned on according to a second turning-on signal STS to clear remnant charges stored in the first capacitor 2026 and charges stored in the third capacitor 2046, respectively; go to Step 402.

In Step 402, at the interval T3 (corresponding to the present period of the transformer 100) in FIG. 3, the first turning-on signal FTS is high, the first switch 2024 and the fourth switch 2044 are turned on, and the first reference current IFR charges the first capacitor 2026 to generate the first voltage FV corresponding to the present period (the interval T3) of the transformer 100, and the second reference current ISR charges the third capacitor 2046 to generate the second voltage SV corresponding to the present period (the interval T3) of the transformer 100. In Step 404, at the interval T3 in FIG. 3, the comparator 206 generates the sample signal SS to the comparator 107 of the control circuit 102 of the transformer 100 according to a first voltage FV corresponding to the previous period (the interval T1) of the transformer 100 and the second voltage SV corresponding to the present period (the interval T3). That is to say, when the first voltage FV (a voltage of an input terminal of the comparator 206) corresponding to the previous period (the interval T1) of the transformer 100 is smaller than the second voltage SV (a voltage of another input terminal of the comparator 206) corresponding to the present period (the interval T3), the comparator 206 generates the sample signal SS. As shown in FIG. 3, because the first reference current IFR is K times the second reference current ISR (that is, the second reference current ISR is greater than the first reference current IFR), a discharge time TDIS(n−1) (that is, length of the first turning-on signal FTS of the transformer 100 at the interval T1) for the first reference current IFR charging the first capacitor 2026 to generate the first voltage FV corresponding to the previous period (the interval T1) of the transformer 100 is longer than a period TS(n) for the second reference current ISR charging the third capacitor 2046 to generate the second voltage SV corresponding to the present period (the interval T3) of the transformer 100. That is to say, the period TS(n) is K times the discharge time TDIS(n−1), where 0<K<1. Thus, the period TS(n) for the comparator 206 generating the sample signal SS is varied with the length (TDIS(n−1)) of the first turning-on signal FTS corresponding to the interval T1. At the interval T1, because the length of the first turning-on signal FTS is varied with the discharge time (TDIS(n−1)) of the previous period (the interval T1) of the transformer 100, the period TS(n) for the comparator 206 generating the sample signal SS is also varied with the discharge time (TDIS(n−1)) of the previous period (the interval T1) of the transformer 100. That is to say, the period TS(n) for the comparator 206 generating the sample signal SS is varied with the load 110. In Step 406, the third switch 2030 is turned on according to the third turning-on signal TTS, and the second capacitor 2032 generates the first voltage FV corresponding to the present period (the interval T3) according to charges stored in the first capacitor 2026 to provide the first voltage FV corresponding to the present period (the interval T3) to the comparator 206. Thus, the comparator 206 can compare a second voltage SV corresponding to a next period of the transformer 100 with the first voltage FV corresponding to the present period (the interval T3) during the next period of the transformer 100. In Step 408, the second switch 2028 and the fifth switch 2048 are turned on according to the second turning-on signal STS to clear the remnant charges stored in the first capacitor 2026 and the charges stored in the third capacitor 2046 during the turning-on time (an interval T4) of the switch 106 of the primary side, so the first voltage FV of the first capacitor 2026 corresponding to the present period (the interval T3) and the second voltage SV of the third capacitor 2046 corresponding to the present period (the interval T3) can be erased. After Step 408, Step 402 to Step 406 can be repeated to continuously generate the variable sample delay time of the transformer 100.

To sum up, the sample-and-hold circuit for generating a variable sample delay time of the transformer and the method thereof utilize the discharge detection unit to generate a first voltage corresponding to a present period of the transformer according to a first turning-on signal and the first reference current, and utilize the sample delay time generation unit to generate a second voltage corresponding to the present period of the transformer according to the first turning-on signal and the second reference current. Then, the comparator generates a sample signal to the control circuit of the transformer according to a first voltage corresponding to a previous period of the transformer and the second voltage corresponding to the present period. Because the first reference current is different from the second reference current, time for the comparator generating the sample signal is varied with a load coupled to the secondary side of the transformer. Therefore, compared to the prior art, the present invention can overcome a disadvantage of the sample-and-hold circuit utilizing a fixed sampling time to sample a voltage of the auxiliary winding.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sample-and-hold circuit for generating a variable sample delay time of a transformer, the sample-and-hold circuit comprising:
    a discharge detection unit for generating a first voltage according to a first turning-on signal and a first reference current, wherein length of the first turning-on signal is varied with a discharge time of a present period of the transformer;
    a sample delay time generation unit for generating a second voltage according to the first turning-on signal and a second reference current; and
    a comparator for generating a sample signal to a control circuit of the transformer according to a first voltage corresponding to a previous period of the transformer and a second voltage corresponding to the present period of the transformer, wherein the first reference current is K times the second reference current, wherein 0<K<1.

2. The sample-and-hold circuit of claim 1, wherein the discharge detection unit comprises:
    a first current source for providing the first reference current;
    a first switch coupled to the first current source for being turned on and turned off according to the first turning-on signal;
    a first capacitor coupled between the first switch and ground, wherein the first reference current charges the first capacitor to generate the first voltage when the first switch is turned on according to the first turning-on signal;
    a second switch coupled between the first switch and the ground for being turned on and turned off according to a second turning-on signal;
    a third switch coupled to the first switch, the first capacitor, and the second switch for being turned on and turned off according to a third turning-on signal; and
    a second capacitor coupled to the third switch, the comparator, and the ground for stabilizing the first voltage when the third switch is turned on according to the third turning-on signal;
    wherein the third switch is turned on according to the third turning-on signal after the first switch is turned off according to the first turning-on signal and before a positive edge of a turning-on time of a switch of a primary side of the transformer, the first capacitor is the same as the second capacitor, and the second switch is turned on according to the second turning-on signal to clear remnant charges stored in the first capacitor during the turning-on time.

3. The sample-and-hold circuit of claim 2, wherein the sample delay time generation unit comprises:
    a second current source for providing the second reference current;
    a fourth switch coupled to the second current source for being turned on and turned off according to the first turning-on signal;
    a third capacitor coupled between the fourth switch and the ground, wherein the second reference current charges the third capacitor to generate the second voltage when the fourth switch according to the first turning-on signal is turned on, wherein the third capacitor is the same as the second capacitor; and
    a fifth switch coupled to the fourth switch, the comparator, and the ground for being turned on and turned off according to the second turning-on signal, wherein the fifth switch is turned on according to the second turning-on signal to clear charges stored in the third capacitor during the turning-on time.

4. The sample-and-hold circuit of claim 1, wherein K is a predetermined ratio.

5. The sample-and-hold circuit of claim 1, wherein K is varied with a voltage of a pin of the control circuit, wherein the voltage of the pin is varied with a load coupled to a secondary side of the transformer.

6. The sample-and-hold circuit of claim 1, further comprising:
    a signal generation unit for generating the first turning-on signal, the second turning-on signal, and the third turning-on signal.

7. A method for generating a variable sample delay time of a transformer, a sample-and-hold circuit for generating the variable sample delay time comprising a discharge detection unit, a sample delay time generation unit, and a comparator, wherein the discharge detection unit comprises a first switch, a first capacitor, a second switch, a third switch, and a second capacitor, the sample delay time generation unit comprises a fourth switch, a third capacitor, and a fifth switch, and the first capacitor, the second capacitor, and the third capacitor are the same, the method comprising:
    generating a first voltage corresponding to a present period of the transformer according to a first turning-on signal and a first reference current, wherein length of the first turning-on signal is varied with a discharge time of the present period of the transformer;
    generating a second voltage corresponding to the present period according to the first turning-on signal and a second reference current; and
    generating a sample signal to a control circuit of the transformer according to a first voltage corresponding to a previous period of the transformer and a second voltage corresponding to the present period;

wherein the first reference current is K times the second reference current, wherein 0<K<1.

8. The method of claim 7, wherein generating the first voltage corresponding to the present period according to the first turning-on signal and the first reference current comprises:

the first reference current charging the first capacitor to generate the first voltage corresponding to the present period when the first switch is turned on according to the first turning-on signal; and the third switch being turned on according to a third turning-on signal and the second capacitor stabilizing the first voltage corresponding to the present period after the first switch is turned off according to the first turning-on signal and before a positive edge of a turning-on time of a switch of a primary side of the transformer.

9. The method of claim 7, wherein generating the second voltage corresponding to the present period according to the first turning-on signal and the second reference current is the second reference current charging the third capacitor to generate the second voltage corresponding to the present period when the fourth switch is turned on according to the first turning-on signal.

10. The method of claim 7, further comprising:

the second switch and the fifth switch being turned on to clear remnant charges stored in the first capacitor and charges stored in the third capacitor according to the second turning-on signal during the turning-on time.

11. The method of claim 7, wherein K is a predetermined ratio.

12. The method of claim 7, wherein K is varied with a voltage of a pin of the control circuit, wherein the voltage of the pin is varied with a load coupled to a secondary side of the transformer.

13. The method of claim 7, wherein the first turning-on signal, the second turning-on signal, and the third turning-on signal are generated by a signal generation unit.

* * * * *